US008089793B1

(12) United States Patent
Gharia

(10) Patent No.: US 8,089,793 B1
(45) Date of Patent: Jan. 3, 2012

(54) DYNAMIC RANDOM ACCESS MEMORY BASED CONTENT ADDRESSABLE STORAGE ELEMENT WITH CONCURRENT READ AND COMPARE

(75) Inventor: Nilesh A. Gharia, San Jose, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 733 days.

(21) Appl. No.: 12/195,299

(22) Filed: Aug. 20, 2008

Related U.S. Application Data

(60) Provisional application No. 60/992,680, filed on Dec. 5, 2007.

(51) Int. Cl.
 *G11C 15/00* (2006.01)
(52) U.S. Cl. .................................. 365/49.12; 365/49.17
(58) Field of Classification Search ............... 365/49.12, 365/49.1, 49.11, 49.13, 49.17; 711/108
 See application file for complete search history.

(56) References Cited

U.S. PATENT DOCUMENTS

| | | | |
|---|---|---|---|
| 5,949,696 A | 9/1999 | Threewitt | |
| 6,188,594 B1 | 2/2001 | Ong | |
| 6,279,133 B1 * | 8/2001 | Vafai et al. ..................... 714/763 |
| 6,362,993 B1 * | 3/2002 | Henderson et al. .......... 365/49.1 |
| 6,421,265 B1 | 7/2002 | Lien et al. | |
| 6,430,073 B1 | 8/2002 | Batson et al. | |
| 6,760,241 B1 | 7/2004 | Gharia | |
| 6,906,937 B1 * | 6/2005 | Nataraj ........................ 365/49.1 |
| 7,016,211 B2 | 3/2006 | Park et al. | |
| 7,228,378 B1 * | 6/2007 | Pereira .......................... 711/108 |
| 7,277,307 B1 * | 10/2007 | Yelluru ....................... 365/49.1 |
| 7,298,635 B1 * | 11/2007 | Maheshwari .............. 365/49.17 |
| 7,924,588 B2 * | 4/2011 | Arsovski et al. ........... 365/49.17 |
| 2004/0114411 A1 * | 6/2004 | Noda et al. ....................... 365/49 |
| 2005/0146947 A1 * | 7/2005 | Higeta et al. ............. 365/189.07 |
| 2008/0144345 A1 * | 6/2008 | Nishiyama et al. ........ 365/49.17 |

\* cited by examiner

*Primary Examiner* — VanThu Nguyen
*Assistant Examiner* — Khamdan Alrobaie
(74) *Attorney, Agent, or Firm* — Mahamedi Paradice Kreisman LLP; William L. Paradice, III

(57) ABSTRACT

A content addressable memory (CAM) cell includes a first storage element for storing a data value, a second storage element for storing the data value, and a compare circuit having first inputs to receive from the first storage element a first complementary data signal indicative of the data value, second inputs to receive from the second storage element a second complementary data signal indicative of the data value, third inputs to receive comparand data, and an output coupled to a match line. The CAM cell allows for simultaneous read and compare operations, as well as simultaneous refresh and compare operations.

10 Claims, 7 Drawing Sheets

DYNAMIC RANDOM ACCESS MEMORY BASED CONTENT ADDRESSABLE STORAGE ELEMENT WITH CONCURRENT READ AND COMPARE

CROSS-REFERENCE TO RELATED APPLICATION

This application claims the benefit under 35 USC 119(e) of the co-pending and commonly owned U.S. Provisional Application No. 60/992,680 entitled "DYNAMIC RANDOM ACCESS MEMORY BASED CONTENT ADDRESSABLE, STORAGE ELEMENT WITH TRANSPARENT REFRESH" filed on Dec. 5, 2007, which is incorporated by reference herein.

TECHNICAL FIELD

The disclosure herein relates generally to content addressable memory (CAM) cells, and more specifically to dynamic random access memory (DRAM) based CAM cells.

BACKGROUND

A content addressable memory (CAM) device is a storage device that is particularly suitable for matching functions because it can be instructed to compare a specific pattern of comparand data with data stored in an associative CAM array. A CAM, also referred to as an associative memory, can include a number of data storage locations, each of which can be accessed by a corresponding address. Functionality of a CAM depends at least in part on whether the CAM includes binary or ternary CAM cells.

Typical binary CAM cells are able to store two states of information, a logic one state and a logic zero state. Binary CAM cells typically include a random access memory (RAM) cell and a compare circuit. The compare circuit compares the comparand data with data stored in the RAM cell and provides the match result to a match line. Columns of binary CAM cells may be globally masked by mask data stored in one or more global mask registers. Ternary CAM cells are mask-per-bit CAM cells that effectively store three states of information, namely a logic one state, a logic zero state, and a don't care state for compare operations. Ternary CAM cells typically include a second RAM cell that stores local mask data for the ternary CAM cell. The local mask data masks the comparison result of the comparand data with the data stored in the first RAM cell such that, when the mask bit has a first predetermined value (a logic low, for example) its compare operation will be masked so that the comparison result does not affect the match line (e.g., always appears to match). The ternary CAM cell offers more flexibility to the user to determine on an entry-per-entry basis which bits in a word will be masked during a compare operation.

Many typical CAM devices use static memory technology. However, dynamic memory technology including dynamic random access memory (DRAM) devices is also being used because it can provide relatively denser and, therefore, larger memory arrays on the same size chip as similar arrays using static memory technology. The efficient search capabilities of CAM devices have proven useful in many applications including address filtering and lookups in routers and networking equipment, for example, and pattern recognition for encryption and/or decryption and compression and/or decompression applications, for example, as well as other pattern recognition applications.

FIG. 1 illustrates an embodiment of a binary DRAM CAM (DCAM) cell 100. The DCAM cell 100 comprises a storage element 110 and a compare circuit 120. The storage element 110 is a DRAM cell including a first transistor 112 and capacitor 114 combination coupled to store a data bit (i.e. a logical one or zero), and a second transistor 116 and capacitor 118 combination coupled to store a complementary data bit. The source (drain) of transistor 112 is coupled to the bit line BL while the source (drain) of transistor 116 is coupled to the complementary bit line $\overline{BL}$; the gates of transistors 112 and 116 are both coupled to the word line WL. The writing of data to and the reading of data from the capacitors 114 and 118 is performed by charge transfer through the bit line BL and complementary bit line $\overline{BL}$, respectively, in response to the logical state of the word line WL.

More specifically, data is written to the storage element 110 by first activating the word line WL, which effectively turns on the transistors 112 and 116 (e.g. places the transistors in a conducting state). Data supplied on the bit lines BL and $\overline{BL}$ is then subsequently stored within the capacitors 114 and 118, respectively. Data is read from the storage element 110 in a similar fashion, by first activating the word line WL. Data stored in the capacitors 114 and 118 is then subsequently read out via the bit lines BL and $\overline{BL}$, respectively.

The compare circuit 120 compares the data stored in the storage element 110 with comparand data provided on compare signal lines CL and $\overline{CL}$. Compare circuit 120 includes NMOS transistors 122, 124, 126, and 128 coupled to perform the comparison function. Transistors 122 and 124 are coupled in series to form a first path through the compare circuit 120, and transistors 126 and 128 are coupled in series to form a second path through the compare circuit 120. The drains (sources) of transistors 122 and 126 are coupled to the match line ML, while the sources of transistors 124 and 128 are coupled to a low voltage source $V_{SS}$ (e.g. ground). The capacitor 114 couples to control the gate of transistor 124 using the stored data of the storage element 110, while the capacitor 118 couples to control the gate of transistor 128 using the stored complementary data of the storage element 110. The compare lines CL and $\overline{CL}$ couple to control the gates of transistors 126 and 122, respectively.

During a compare operation, the match line ML is precharged to a high voltage (e.g. logical one state) to signal a "hit" condition. If the data stored in the storage element 110 matches the comparand data provided on the compare line CL and the complementary compare line $\overline{CL}$, the transistors 122, 124, 126, and 128 form an open circuit between the match line ML and the low voltage source $V_{SS}$. Thus, the match line ML remains charged to the logical one state. However, in the event of a mismatch, the transistors 122, 124, 126, and 128 will form a short circuit between the match line ML and the low voltage source $V_{SS}$. Thus, the match line ML will be subsequently discharged to the low potential $V_{SS}$ (e.g. logical zero state) to signal a "miss" condition.

Over time, charges stored on capacitors 114 and 118 may gradually dissipate, via leakage current, through the transistors 112 and 116. For example, charge may be lost due to channel leakage (drain to source), gate leakage (gate to source, gate to drain), drain leakage (drain to substrate, drain to VDD), leakage from the capacitors 114 and 118, and/or any combination thereof. Thus, a logical one data bit stored on the capacitor 114 or 118 may eventually become a logical zero data bit. This makes maintaining the data stored within the storage element 110 a critical issue.

Prior methods for addressing this issue have been to bias the substrate in which the transistors 112 and 116 are disposed. For example, applying a negative voltage bias to the substrate (transistor well) effectively increases the gate threshold voltages of the transistors 112 and 116. This decreases the likelihood that a channel will be formed between the source and drain of the transistors 112 and 116, thus reducing leakage of the charges stored on capacitors 114 and 118, respectively. It is important to note that biasing the substrate merely reduces the cumulative leakage current, it does not prevent current from leaking altogether. On the other hand, biasing the substrate may have an adverse affect on the compare circuit 120. For example, in the interest of maximizing die space, the transistors 122, 124, 126, and 128 of the compare circuit 120 are typically disposed on the same substrate as the transistors 112 and 116 of the storage element 110. Thus, a bias applied to the substrate of transistors 112 and 116 is similarly applied to the transistors 122, 124, 126, and 128. This increases the threshold voltages $V_{TH}$ of the compare transistors 122, 124, 126, and 128, resulting in slower compare times and/or requiring a higher voltage be applied to the compare lines CL and $\overline{CL}$ during compare operations.

Alternatively, the compare circuit 120 may be disposed on a substrate that is isolated from that of the storage element 110, in order to prevent the bias applied to the storage element 110 substrate from adversely affecting that of the compare circuit 120. However, the result is in an overall increase in die area for the DCAM 100, as the storage element 110 and the compare circuit 120 must be disposed farther apart from one another.

BRIEF DESCRIPTION OF THE DRAWINGS

The disclosure herein is illustrated by way of example, and not by way of limitation, in the figures of the accompanying drawings and in which like reference numerals refer to similar elements and in which.

DETAILED DESCRIPTION

In present embodiments, a dynamic random access memory based content addressable memory (DCAM) cell is disclosed capable of maintaining data stored therein while minimizing die penalty. In specific embodiments, a DCAM is disclosed having continuous refresh capabilities. In one embodiment, the DCAM cell refreshes its data automatically. In other embodiments, data stored in the DCAM cell is refreshed concurrently with a read or compare operation (transparent refresh).

Figure 1:
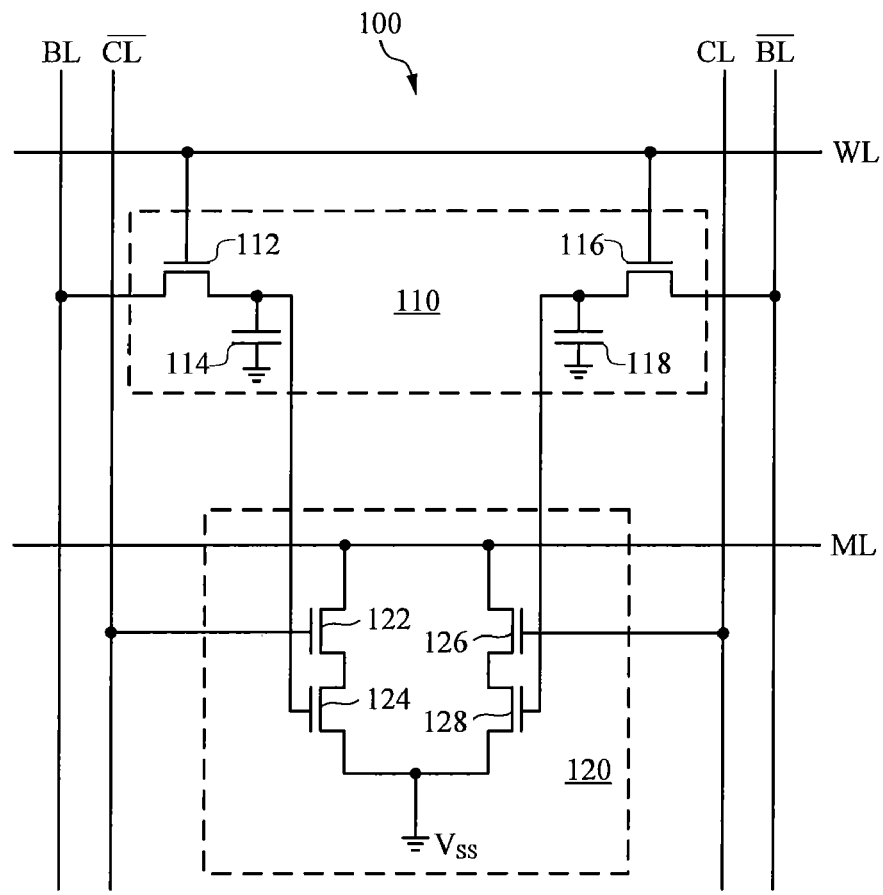
FIG. 1 illustrates an embodiment of a binary DRAM CAM cell.
Figure 2:
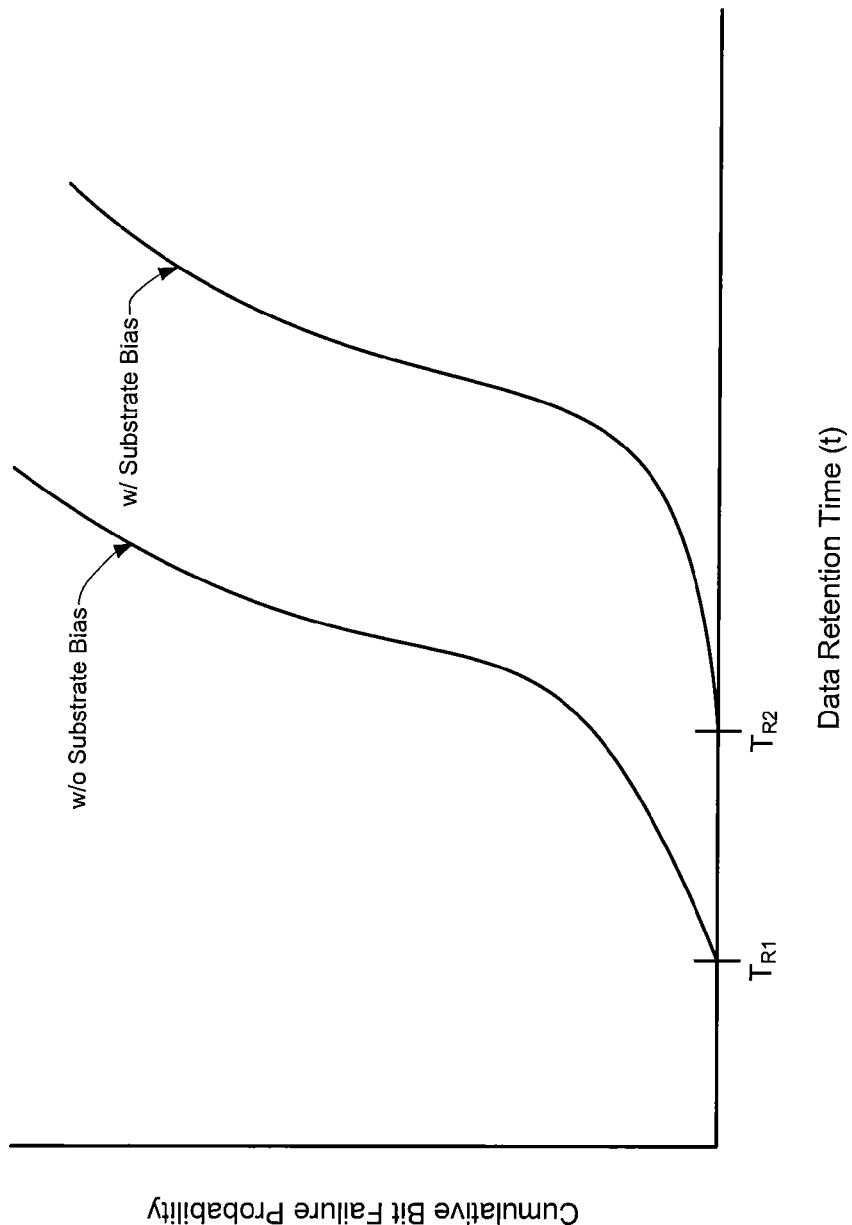
FIG. 2 illustrates a graph of cumulative bit failure probability over time.

Referring again to the embodiment of FIG. 1, it was previously discussed that the charges stored on the capacitors 114 and 118 may gradually dissipate, via leakage current, across transistors 112 and 116. FIG. 2 illustrates a graph of cumulative bit failure probability over time for the data stored on capacitors 114 and 118. It is important to note that, when a voltage bias is applied to the substrate in which the storage element 110 is disposed, the capacitors 114 and 118 are capable of retaining charge stored therein for a duration $T_{R2}$, after which the cumulative bit failure probability begins to increase. On the other hand, when no voltage bias is applied to the substrate, the capacitors 114 and 118 are capable of retaining their charges for only a shorter duration $T_{R1}$, after which the cumulative bit failure begins to increase. The cumulative bit failure probability represents the probability that enough charge will dissipate from the capacitors 114 and 118 (e.g. due to the cumulative effects of the leakage currents described above) such that the capacitors 114 and 118 are unable to retain their original data values. Thus, it is possible to maintain data stored on the capacitors 114 and 118 for extended periods of time, so long as the data is continuously refreshed (i.e. re-rewritten to the capacitors) at a frequency that is at least equal to (or greater than) the retention times $T_{R1}$ or $T_{R2}$ (depending on whether or not a voltage bias is applied to the substrate).

Still referring to the embodiment of FIG. 1, it should be noted that the retention times $T_{R1}$ and $T_{R2}$ directly affect the operation of the DCAM cell 100. For example, data within the storage element 110 may not be refreshed while a compare operation is taking place in the compare circuit 120, as doing so may likely result in incorrect comparisons. In other words, a refresh cycle must end before a compare cycle may begin, and vice-versa. However, data stored in the storage element 110 must be refreshed by or before the given retention time $T_{R1}$ or $T_{R2}$ (depending on whether or not a voltage bias is applied to the substrate).

Figure 3:
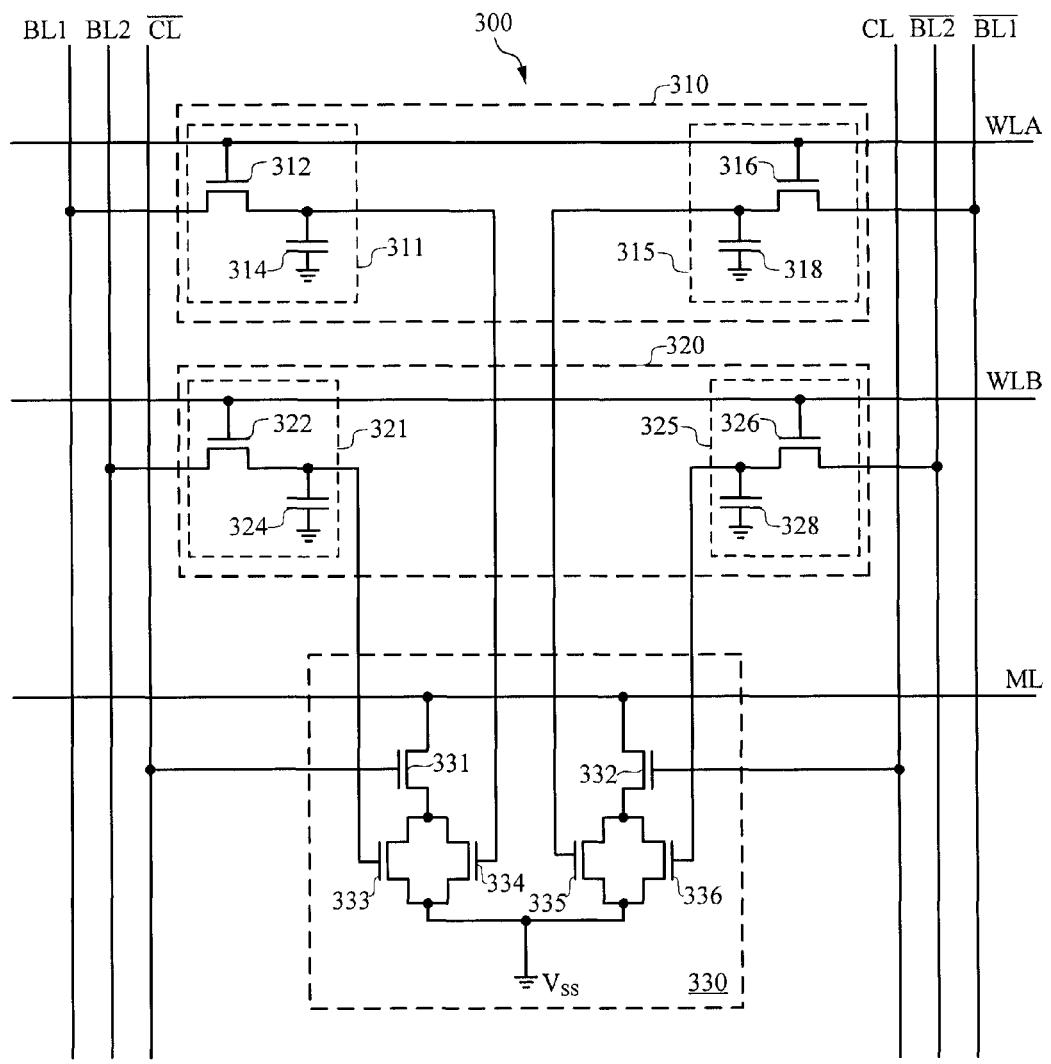
FIG. 3 illustrates a binary DRAM CAM cell according to one of the present embodiments.

FIG. 3 illustrates a binary DCAM cell according to one of the present embodiments. The DCAM cell 300 comprises storage elements 310 and 320 and a compare circuit 330. For the exemplary embodiment shown in FIG. 3, storage element cell 310 includes two DRAM cells 311 and 315, with DRAM cell 311 including a first transistor 312 and capacitor 314 combination coupled to store a data bit (i.e. a logical one or zero), and DRAM cell 315 including a second transistor 316 and capacitor 318 combination coupled to store a complementary data bit. The source (drain) of transistor 312 is coupled to the bit line BL1 while the source (drain) of transistor 316 is coupled to the complementary bit line $\overline{BL1}$; the gates of transistors 312 and 316 are both coupled to the word line WLA. The writing of data to and the reading of data from the capacitors 314 and 318 is performed by charge transfer through the bit line BL1 and complementary bit line $\overline{BL1}$, respectively, in response to the logical state of the word line WLA. Storage cell 320 includes two DRAM cells 321 and 325, with DRAM cell 321 including a third transistor 322 and capacitor 324 combination coupled to store a data bit, and DRAM cell 325 including a fourth transistor 326 and capacitor 328 combination coupled to store a complementary data bit. The source (drain) of transistor 322 is coupled to the bit line BL2 while the source (drain) of transistor 326 is coupled to the complementary bit line $\overline{BL2}$; the gates of transistors 322 and 326 are both coupled to the word line WLB. The writing of data to the reading of data from the capacitors 324 and 328 is performed by charge transfer through the bit line BL2 and complementary bit line $\overline{BL2}$, respectively, in response to the logical state of the word line WLB.

According to some embodiments, a write operation is performed on both storage elements 310 and 320, concurrently, by first activating the word lines WLA and WLB. Data supplied on the bit line pairs BL1/$\overline{BL1}$ and BL2/$\overline{BL2}$ is then subsequently stored within the storage elements 310 (capacitors 314 and 318) and 320 (capacitors 324 and 328), respectively. It should be noted that the DCAM cell 300 is typically used to store a single bit of data. Thus, in one embodiment, the same bit of data is provided on both bit line pairs BL1/$\overline{BL1}$ and BL2/$\overline{BL2}$ during a write operation. Thus, storage element 320 effectively stores a copy of the data stored by storage element 310. For other embodiments, data can be written to storage elements 310 and 320 sequentially (e.g., in a temporally non-overlapping manner).

According to some embodiments, a read operation may be performed on the storage elements 310 and 320 individually, by successively activating the word lines WLA and WLB. For example, when the word line WLA is activated, data stored in storage element 310 (capacitors 314 and 318) may be read out via the bit lines BL1 and $\overline{BL1}$. Similarly, when word line WLB is activated, data stored in storage element 320 (capacitors 324 and 328) may be read out via the bit lines BL2 and $\overline{BL2}$. In one embodiment, the data stored in storage element 320 may be refreshed (i.e. rewritten) while data stored in storage element 310 is being read out, and vice-versa. This allows for the data stored in both storage elements 310 and 320 to be continuously refreshed, at rate that is substantially equal to (or greater than) the data retention time $T_R$. This transparent refreshing operation enables the data stored in the DCAM cell 300 to be maintained, while minimizing die penalty.

The compare circuit 330 compares the data stored in the storage elements 310 and 320 with comparand data provided on compare signal lines CL and $\overline{CL}$. Compare circuit 330 includes transistors 331-336 coupled to perform the comparison function. The drains (sources) of transistors 331 and 332 are coupled to the match line ML, while the sources of transistors 333-336 are coupled to a low voltage source $V_{SS}$ (e.g. ground). The capacitors 314 and 324 are coupled to control the gates of transistors 334 and 333, respectively, using the stored data of storage elements 310 and 320. The capacitors 318 and 328 are coupled to control the gates of transistors 335 and 336, respectively, using the stored complementary data of storage elements 310 and 320. The compare lines CL and $\overline{CL}$ couple to control the gates of transistors 332 and 331, respectively.

According to one embodiment, a compare operation is performed by first pre-charging the match line ML to a high voltage (e.g. logical one state) to signal a "hit" condition. If the data stored in the capacitors 314 and 324 matches the data on the compare line CL (and the complementary data stored in the capacitors 318 and 328 matches the data on the complementary compare line $\overline{CL}$), the transistors 331-336 form an open circuit between the match line ML and the low voltage source $V_{SS}$. Thus, the match line ML remains charged to the logical one state to indicate the match condition. However, in the event of a mismatch, the transistors 331-336 will form a short circuit between the match line ML and the low voltage source $V_{SS}$. Thus, the match line ML will be subsequently discharged to the low potential $V_{SS}$ (e.g. logical zero state) to signal a "miss" (e.g., mismatch) condition. It is important to note that, in this manner, data stored in the storage elements 310 and 320 may be continuously refreshed (e.g. in succession), with no adverse affect on the number of compare operations taking place within a given retention period $T_{R1}$ or $T_{R2}$. In other words, refresh cycles and compare cycles may take place continuously and concurrently. For example, data may be written to storage element 310 while data stored in storage element 320 is used for a compare operation, and vice-versa. It should also be noted that read and compare operations may be performed concurrently in the DCAM 300 of FIG. 3. For example, data may be read from storage element 310 while data stored in storage element 320 is used for a compare operation, and vice-versa.

When performing compare and refresh operations in parallel, it is important to apply proper voltage values to the bit lines BL1, BL2, $\overline{BL1}$, and $\overline{BL2}$. For example, when refreshing a logical zero bit of data into the capacitor 314 it is possible that such logical zero bit may be sufficient to turn on the transistor 334 (i.e. interpreted as a logical one by the transistor 334), depending on the specifications of the transistor 334. This may result in an inaccurate (or invalid) compare operation taking place concurrently within the compare circuit 330. Thus, in order to avoid this issue entirely, each of the bit lines BL1, BL2, $\overline{BL1}$, and $\overline{BL2}$ should be pre-charged to a voltage that is lower than the threshold voltage $V_{TH}$ of the respective transistors 334, 333, 335, and 336.

According to an embodiment, the DCAM 300 of FIG. 3 may have a reduced die penalty in comparison to the DCAM 100 of FIG. 1. For example, the transparent refresh operation of DCAM 300 allows data to be maintained within the storage elements 310 and 320 without the need to apply a voltage bias to the substrate in which the circuit elements are disposed. Thus, the compare circuit 330 and the storage elements 310 and 320 may all be disposed in closer vicinity to one another, on the same substrate.

According to another embodiment, the DCAM 300 of FIG. 3 may have a reduction in power in comparison to the DCAM 100 of FIG. 1. For example, the transparent refresh operation of DCAM 300 allows data to be maintained within the storage elements 310 and 320 without the need to apply a voltage bias to the substrate in which the circuit elements are disposed. This further eliminates the need to apply a higher voltage to the compare lines CL and $\overline{CL}$ (e.g. to overcome the increased voltage threshold $V_{TH}$ due to the substrate bias) when performing compare operations.

Figure 4:
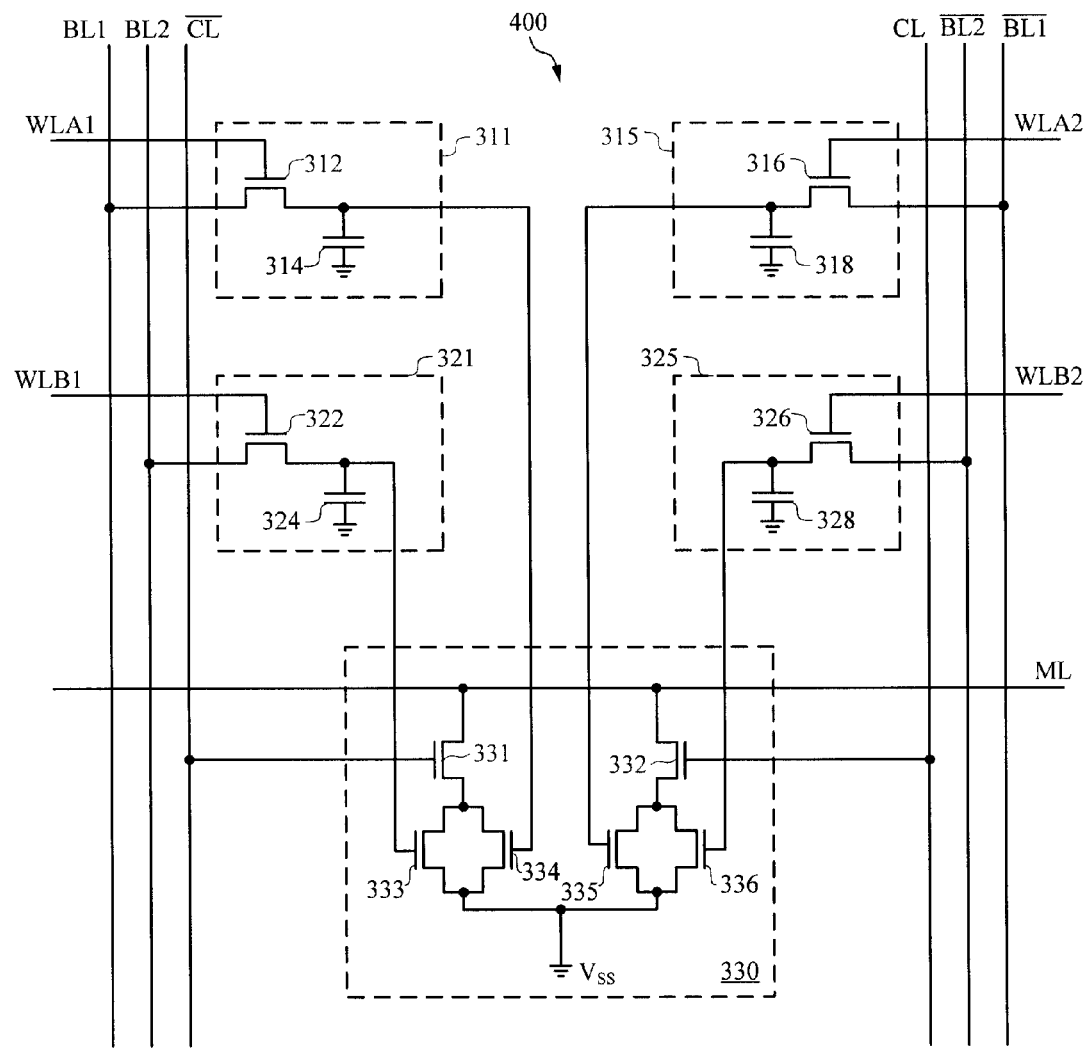
FIG. 4 illustrates a DRAM CAM cell according to another of the present embodiments.

FIG. 4 illustrates a binary DCAM cell 400 according to an alternative embodiment. In the embodiment of FIG. 4, the word lines WLA and WLB are divided into word lines WLA1 and WLA2, and WLB1 and WLB2, respectively, where WLA1 controls access to DRAM cell 311, WLA2 controls access to DRAM cell 315, WLB1 controls access to DRAM cell 321, and WLB2 controls access to DRAM cell 325. According to this embodiment, the data stored in DCAM 400 may be refreshed with a finer granularity. For example, refreshing operations may take place within any of the capacitors 314, 318, 324, and 328 of DRAM cells 311, 315, 321, and 325, respectively, independently of one another.

Figure 5:
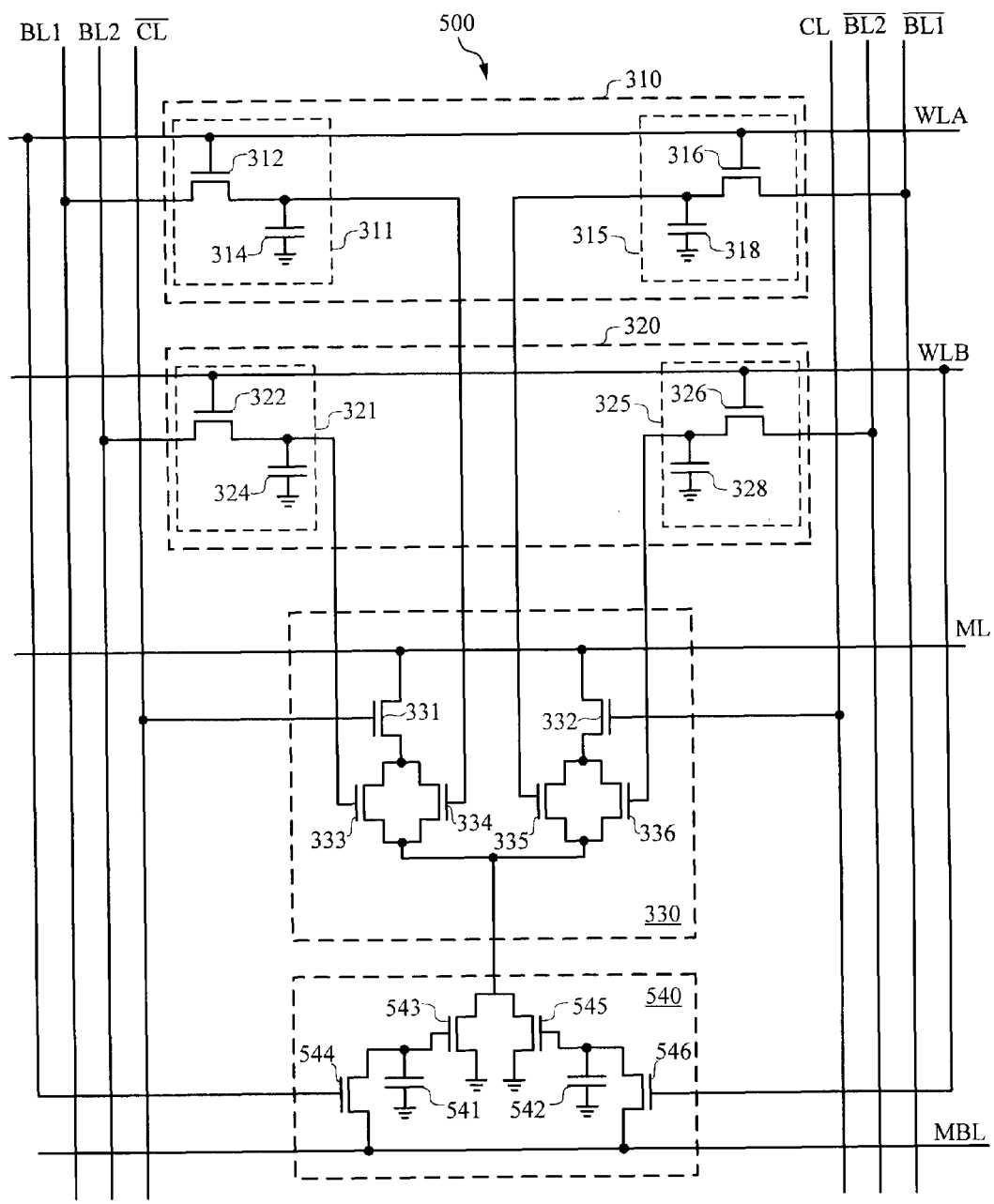
FIG. 5 illustrates a ternary DRAM CAM cell according to one embodiment.

FIG. 5 illustrates a ternary DCAM cell 500 according to another embodiment. The DCAM cell 300 comprises storage elements 310 and 320, compare circuit 330, and a masking circuit 540. The masking circuit 540 includes two DRAM cells, comprising transistors 544 and 546 and capacitors 541 and 542, respectively. The source (drain) of transistor 544 is coupled to the mask bit line MBL while the gate of the transistor 544 is coupled to the word line WLA. Similarly, the source (drain) of transistor 546 is coupled to the mask bit line MBL while the gate of the transistor 546 is coupled to the word line WLB. The writing of data to and the reading of data from the capacitors 541 and 542 is performed by charge transfer through the mask bit lines MBL and transistors 544 and 546, respectively, in response to the logical state of the respective word lines WLA and WLB.

The masking circuit 540 further includes mask control transistors 543 and 545. Local mask data stored on the capacitors 541 and 542 controls the gates, and thus the conducting states, of the mask control transistors 543 and 545, respectively. The drains (sources) of mask control transistors 543 and 545 are coupled to the sources (drains) of transistors 333-336 of the compare circuit 330. The sources of the mask control transistors 543 and 545 are coupled to a logic-low potential (e.g. $V_{SS}$ or ground). When the local mask data is a logical one, indicating a non-mask condition, the mask control transistors 543 and 545 are on, or conducting, such that the comparison results generated by the compare circuit 330 control the logic state of the match line. When, however, the local mask data is a logic zero, indicating a mask condition, the mask control transistors 543 and 545 are off, or non-conducting, such that the compare results generated by the compare circuit 330 do not affect the logical state of the match line ML (e.g., by preventing the match line ML from discharging to ground potential through masking circuit 540).

According to some embodiments, one of the masked data stored on one of the capacitors 541 or 542 may be refreshed while the mask data stored on the other is being used in a compare operation, and vice-versa. For example, mask data stored in the capacitor 541 may be refreshed concurrently with data stored in the storage element 310 (e.g. when the word line WLA is activated), while mask data stored in the capacitor 542 may be refreshed concurrently with data stored in the storage element 320 (when the word line WLB is activated). This allows for transparent refreshing of the mask data in the mask circuit 540 while performing a compare operation, concurrently.

When performing compare and refresh mask data operations in parallel, it is important to apply proper voltage values to the mask bit line MBL. For example, when refreshing a logical zero bit of data into the capacitor 541, it is possible that such logical zero bit may be sufficient to turn on the transistor 543 (i.e. interpreted as a logical one by the transistor 543), depending on the specifications of the transistor 543. This may result in an inaccurate (or invalid) compare operation taking place concurrently. Thus, in order to avoid this issue entirely, the mask bit line MBL should be pre-charged to a voltage that is lower than the threshold voltage $V_{TH}$ of the transistors 543 and 545.

For other embodiments of ternary DCAM cell 500, transistors 545-546 and capacitor 542 can be eliminated.

For the purposes of discussion, only binary and ternary embodiments of the DCAM cell having transparent refresh capabilities are disclosed herein. However, it should be noted that one of ordinary skill in the art may apply the principles disclosed herein to any other types of CAM devices (e.g. quaternary or XY-type CAM devices) by making only slight modifications to the disclosed embodiments.

Figure 6:
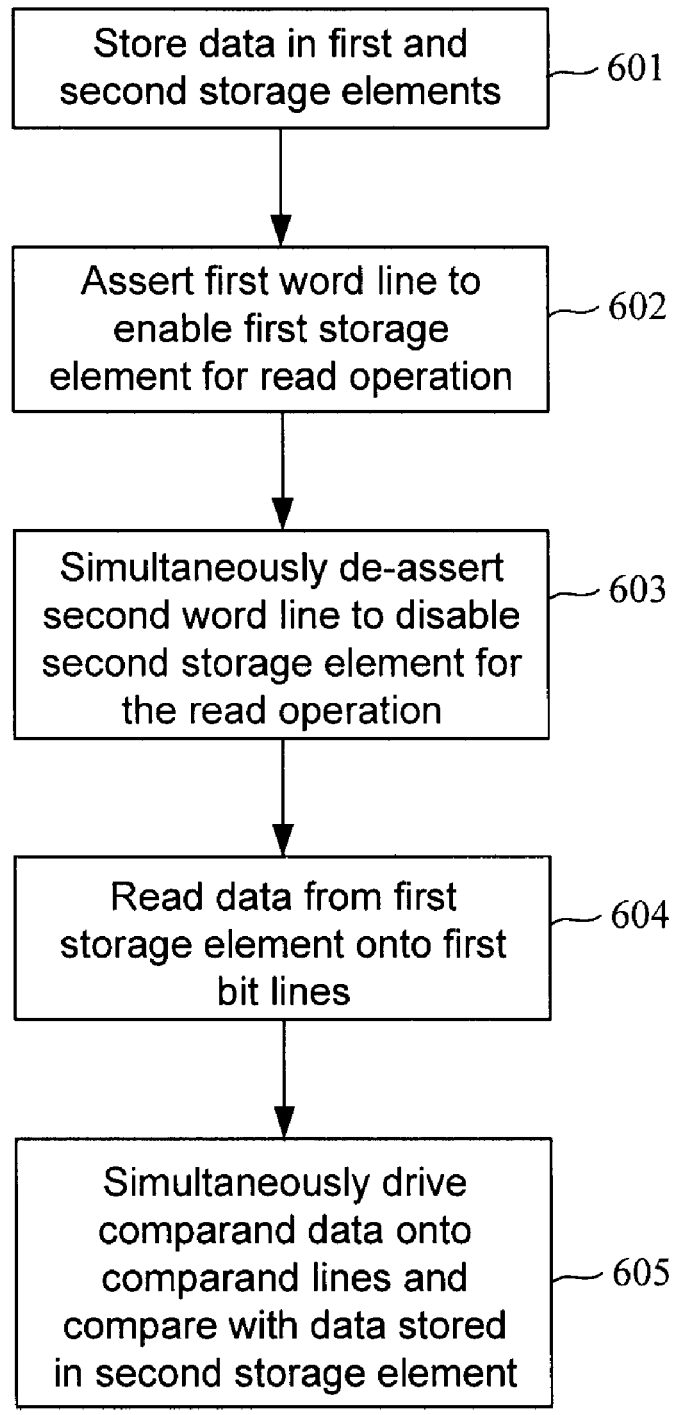
FIG. 6 is an illustrative flow chart depicting simultaneous read and compare operations in the DRAM CAM cell of FIG. 3.

As mentioned above, data stored in one of storage elements 310/320 can be read out while data in the other of storage elements 310/320 is compared. More specifically, an exemplary operation for simultaneously performing read an compare operations in DRAM cell 300 is described below with respect to the illustrative flow chart of FIG. 6. First, a data value is stored in the first and second storage elements 310/320 of DCAM cell 300 (step 601). Then, the first word line WLA is asserted to enable data the first storage element for a read operation (step 602). Simultaneously, the second word line WLB is de-asserted to disable the second storage element for the read operation (step 603). Then, data is read from the first storage element 310 onto the first bit line pair BL1/$\overline{BL1}$ (step 604). Simultaneously, comparand data is driven onto comparand lines CL/$\overline{CL}$ of the DCAM cell 300 and compared with the data stored in the second storage element 320 (step 605).

Figure 7:
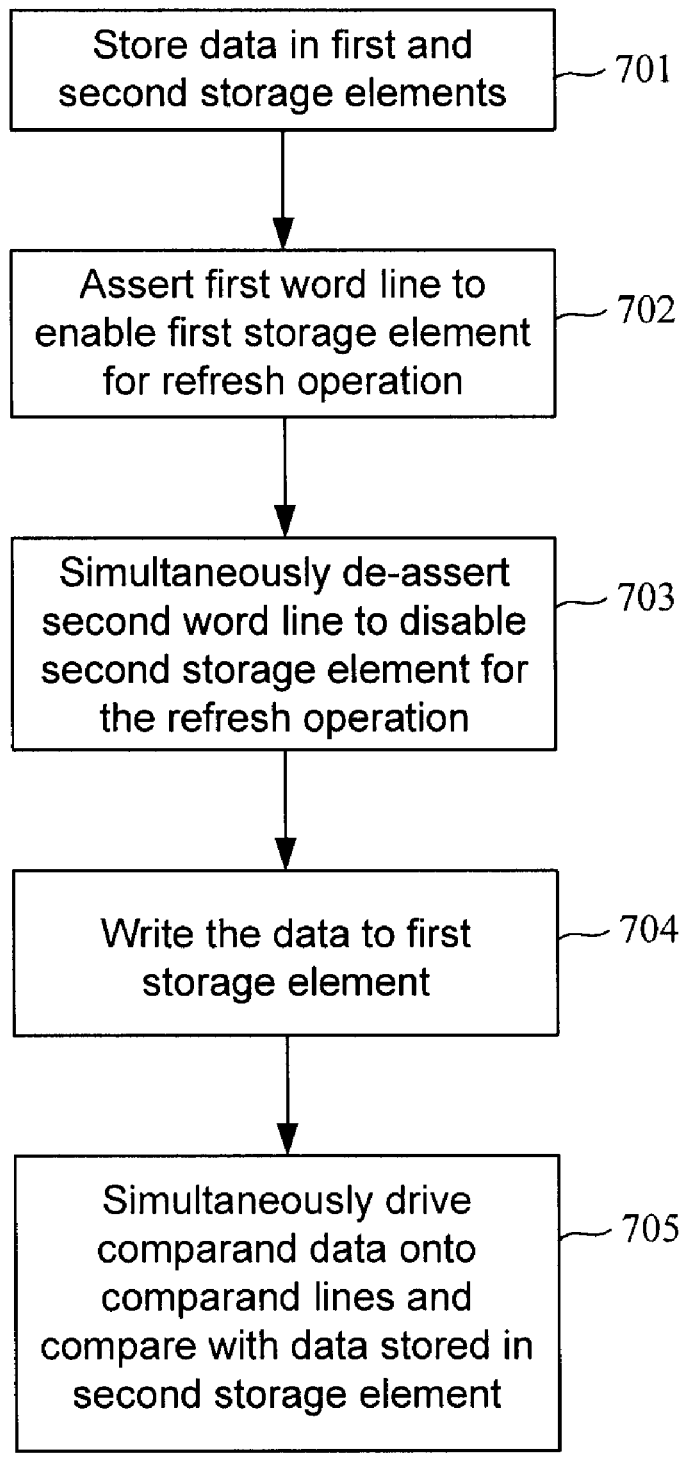
FIG. 7 is an illustrative flow chart depicting simultaneous refresh and compare operations in the DRAM CAM cell of FIG. 3.

Further, as mentioned above, data stored in one of storage elements 310/320 can be read out while data in the other of storage elements 310/320 is refreshed. More specifically, an exemplary operation for simultaneously performing refresh and compare operations in DRAM cell 300 is described below with respect to the illustrative flow chart of FIG. 7. First, a data value is stored in the first and second storage elements 310/320 of DCAM cell 300 (step 701). Then, the first word line WLA is asserted to enable data the first storage element for a refresh (e.g., write) operation (step 702). Simultaneously, the second word line WLB is de-asserted to disable the second storage element for the refresh operation (step 703). Then, the data is written to the first storage element 310 via the first bit line pair BL1/$\overline{BL1}$ to refresh the data stored therein (step 704). Simultaneously, comparand data is driven onto comparand lines CL/$\overline{CL}$ of the DCAM cell 300 and compared with the data stored in the second storage element 320 (step 705).

It should be noted that the various integrated circuits, dice and packages disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A content addressable memory (CAM) cell comprising:
    a first storage element for storing a data value, wherein the first storage element comprises first and second dynamic random access memory (DRAM) cells;
    a second storage element for storing the data value, wherein the second storage element comprises third and fourth DRAM cells; and
    a compare circuit having first inputs to receive from the first storage element a first complementary data signal indicative of the data value, second inputs to receive from the second storage element a second complementary data signal indicative of the data value, third inputs to receive comparand data, and an output coupled to a match line, wherein the compare circuit comprises:
        first and second transistors coupled in parallel between a first node and a voltage source, the first transistor having a gate coupled to the first DRAM cell of the first memory element and the second transistor having a gate coupled to the third DRAM cell of the second memory element;
        third and fourth transistors coupled in parallel between a second node and the voltage source, the third transistor having a gate coupled to the second DRAM cell of the first memory element and the fourth transistor having a gate coupled to the fourth DRAM cell of the second memory element;
        a fifth transistor coupled between the match line and the first node, and having a gate to receive a comparand bit; and
        a sixth transistor coupled between the match line and the second node, and having a gate to receive a complementary comparand bit.

2. The CAM cell of claim 1, further comprising:
    a first pair of complementary bit lines coupled to the first storage element; and
    a second pair of complementary bit lines coupled to the second storage element.

3. The CAM cell of claim 1, further comprising a first word line coupled to the first storage element, and a second word line coupled to the second storage element.

4. The CAM cell of claim 1, wherein:
    the first DRAM cell is to store the data value, and the second DRAM cell is to store a complementary data value; and
    the third DRAM cell is to store the data value, and the fourth DRAM cell is to store the complementary data value.

5. The CAM cell of claim 1, further comprising a first word line coupled to the first DRAM cell, a second word line coupled to the second DRAM cell, a third word line coupled to the third DRAM cell, and a fourth word line coupled to the fourth DRAM cell.

6. The CAM cell of claim 1, wherein the CAM cell comprises a ternary CAM cell.

7. A method of simultaneously performing read and compare operations in a content addressable memory (CAM) cell, comprising:
    storing a data value in a first storage element of the CAM cell;
    storing the data value in a second storage element of the CAM cell;
    asserting a first word line coupled to the first storage element to enable the first storage element for a read operation;
    simultaneously de-asserting a second word line coupled to the second storage element, along with asserting the first word line, to disable the second storage element for the read operation;
    reading data from the first storage element; and
    driving comparand data onto comparand lines of the CAM cell to compare the comparand data with the data value stored in the second storage element at the same time as reading data from the first storage element, wherein during the compare operation, the data value is driven to gates of first and second transistors connected in parallel.

8. The method of claim 7, wherein:
    the first storage element includes a first dynamic random access memory (DRAM) cell for storing the data value, and includes a second DRAM cell for storing a complementary data value; and
    the second storage element includes a third DRAM cell for storing the data value, and includes a fourth DRAM cell for storing the complementary data value.

9. A method of simultaneously performing refresh and compare operations in a content addressable memory (CAM) cell, comprising:
    storing a data value in a first storage element of the CAM cell;

storing the data value in a second storage element of the CAM cell;
asserting a first word line coupled to the first storage element to enable the first storage element for a refresh operation;
simultaneously de-asserting a second word line coupled to the second storage element, along with asserting the first word line, to disable the second storage element for the refresh operation;
writing the data value to the first storage element; and
driving comparand data onto comparand lines of the CAM cell to compare the comparand data with the data value stored in the second storage element at the same time as writing the data value to the first storage element, wherein during the compare operation, the data value is driven to gates of first and second transistors connected in parallel.

10. The method of claim 9, wherein:
the first storage element includes a first dynamic random access memory (DRAM) cell for storing the data value, and includes a second DRAM cell for storing a complementary data value; and
the second storage element includes a third DRAM cell for storing the data value, and includes a fourth DRAM cell for storing the complementary data value.

* * * * *